(12) United States Patent
Chu

(10) Patent No.: US 9,865,725 B2
(45) Date of Patent: Jan. 9, 2018

(54) III-NITRIDE TRANSISTOR WITH TRENCH GATE

(71) Applicant: HRL Laboratories, LLC, Malibu, CA (US)

(72) Inventor: Rongming Chu, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/099,390

(22) Filed: Apr. 14, 2016

(65) Prior Publication Data

US 2016/0308040 A1 Oct. 20, 2016

Related U.S. Application Data

(60) Provisional application No. 62/147,325, filed on Apr. 14, 2015.

(51) Int. Cl.
*H01L 29/66* (2006.01)
*H01L 29/778* (2006.01)
(Continued)

(52) U.S. Cl.
CPC ...... *H01L 29/7788* (2013.01); *H01L 21/0254* (2013.01); *H01L 21/0262* (2013.01);
(Continued)

(58) Field of Classification Search
CPC ......... H01L 29/66431; H01L 29/66462; H01L 29/775–29/7789; H01L 2924/13064; H01L 29/802; H01L 21/8224; H01L 21/82285; H01L 21/823487; H01L 21/823885; H01L 29/4236; H01L 29/66704; H01L 29/66734; H01L 29/7813; H01L 29/7825
See application file for complete search history.

(56) References Cited

U.S. PATENT DOCUMENTS

| | | | | |
|---|---|---|---|---|
| 2006/0220042 | A1* | 10/2006 | Yaegashi | H01L 21/28575 257/94 |
| 2006/0220060 | A1* | 10/2006 | Nakata | H01L 29/42316 257/189 |

(Continued)

FOREIGN PATENT DOCUMENTS

JP 2007103727 4/2007

OTHER PUBLICATIONS

International Search Report and Written Opinion from PCT/US16/27613 dated Jun. 30, 2016.

(Continued)

*Primary Examiner* — Cuong B Nguyen
(74) *Attorney, Agent, or Firm* — Ladas & Parry

(57) ABSTRACT

A transistor includes a stack of III-nitride semiconductor layers, the stack having a frontside and a backside, a source electrode in contact with the frontside of the stack, a drain electrode in contact with the backside of the stack, a trench extending through a portion of the stack, the trench having a sidewall, and a gate structure formed in the trench, including an AlN layer formed on the sidewall of the trench, an insulating cap layer formed on the AlN layer, and a gate electrode formed on the insulator cap layer and covering the sidewall of the trench.

29 Claims, 7 Drawing Sheets

(51) Int. Cl.

| | |
|---|---|
| *H01L 21/02* | (2006.01) |
| *H01L 29/08* | (2006.01) |
| *H01L 29/10* | (2006.01) |
| *H01L 29/417* | (2006.01) |
| *H01L 29/51* | (2006.01) |
| *H01L 29/78* | (2006.01) |
| *H01L 29/20* | (2006.01) |
| *H01L 29/205* | (2006.01) |
| *H01L 29/423* | (2006.01) |

(52) U.S. Cl.
CPC .. *H01L 21/02178* (2013.01); *H01L 21/02266* (2013.01); *H01L 21/02271* (2013.01); *H01L 21/02631* (2013.01); *H01L 29/0847* (2013.01); *H01L 29/1037* (2013.01); *H01L 29/41741* (2013.01); *H01L 29/513* (2013.01); *H01L 29/66462* (2013.01); *H01L 29/7787* (2013.01); *H01L 29/7789* (2013.01); *H01L 29/7813* (2013.01); *H01L 29/7828* (2013.01); *H01L 29/2003* (2013.01); *H01L 29/205* (2013.01); *H01L 29/4236* (2013.01)

(56) References Cited

U.S. PATENT DOCUMENTS

| | | | |
|---|---|---|---|
| 2009/0114923 A1 | 5/2009 | Iwamuro | |
| 2013/0168739 A1 | 7/2013 | Kiyama et al. | |
| 2013/0221434 A1 | 8/2013 | Okada et al. | |
| 2013/0313564 A1* | 11/2013 | Okada | H01L 21/8252 257/76 |
| 2013/0316507 A1* | 11/2013 | Saitoh | H01L 29/2003 438/285 |
| 2014/0110758 A1 | 4/2014 | Saitoh et al. | |
| 2015/0349117 A1* | 12/2015 | Chu | H01L 29/7827 257/66 |

OTHER PUBLICATIONS

Okada et al., "Novel Vertical Heterojunction Field-Effect Transistors with Re-grown AlGaN/GaN Two-Dimensional Electron Gas Channels on GaN Substrates," Applied Physics Express, pp. 054201-01-054201-03, 2010.

* cited by examiner

US 9,865,725 B2

III-NITRIDE TRANSISTOR WITH TRENCH GATE

CROSS REFERENCE TO RELATED APPLICATIONS

This application is related to and claims the benefit of priority of U.S. Provisional Patent Application No. 62/147,325, filed Apr. 14, 2015, which is incorporated herein by reference as though set forth in full.

STATEMENT REGARDING FEDERAL FUNDING

This invention was made under U.S. Government contract DE-AR000450 issued by ARPA-E. The U.S. Government has certain rights in this invention.

BACKGROUND

Technical Field

The present technology relates to transistors for high-efficiency power switching, and normally off operation.

Discussion of the Related Art

High-performance power switching devices are critical for energy-efficient power conversion. Such devices enable power switching products that may be used in the electrical systems of aircraft and automobiles.

High performance power switches require low on-resistance and normally-off operation. For III-nitride transistors, there is a tradeoff between low on-resistance and normally-off operation. Low channel resistance is typically achieved by fabricating an AlGaN/GaN heterojunction in which electrons transport at high mobility. However, electron accumulation occurs in the AlGaN/GaN heterojunction, resulting in a normally-on operation.

Prior examples of such transistors used a trench gate structure with a re-grown AlGaN layer on the sidewalls to create a high mobility channel. Such a design operates with low on-resistance; however, it also operates in normally-on mode, which can lead to unsafe operation in some applications.

A trench gate structure with a re-grown AlGaN layer on the sidewalls to create a high mobility channel is described by Okada et al. in, "Novel Vertical Heterojunction Field-Effect Transistors with Re-grown AlGaN/GaN Two-Dimensional Electron Gas Channels on GaN Substrates," Applied Physics Express, 2010. While this approach has the advantage of low on-resistance, it has the disadvantage of operating in normally-on mode.

An improved high performance power switch which can provide low on-resistance and operation in a normally-off mode is desirable.

SUMMARY

The present disclosure describes a III-nitride transistor for a high-efficiency power switching transistor having high current density, low on-resistance, and a normally off gate compatible with a high-electron-mobility channel exhibiting a low channel resistance.

In a first embodiment disclosed herein, a transistor comprises a stack of III-nitride semiconductor layers, the stack having a frontside and a backside, a source electrode in contact with the frontside of the stack, a drain electrode in contact with the backside of the stack, a trench extending through a portion of the stack, the trench having a sidewall, and a gate structure formed in the trench comprising an AlN layer formed on the sidewall of the trench, an insulating cap layer formed on the AlN layer, and a gate electrode formed on the insulator cap layer and covering the sidewall of the trench.

In another embodiment disclosed herein, a method of fabricating a transistor comprises forming a stack of III-nitride semiconductor layers, the stack having a frontside and a backside, forming a source electrode on the frontside of the stack, forming a drain electrode on the backside of the stack, forming a trench extending through a portion of the stack, the trench having a sidewall, and forming a gate structure in the trench comprising forming an AlN layer on the sidewall of the trench, forming an insulating cap layer on the AlN layer, and forming a gate electrode on the insulator cap layer and covering the sidewall of the trench.

In yet another embodiment disclosed herein, a transistor comprises a source electrode, a drain electrode, a drain contact layer comprising n+ GaN, the drain contact layer in contact with the drain electrode, a channel layer of n– GaN on the drain contact layer, a p– layer of AlGaN or GaN on the channel layer; and a source contact layer of n+ GaN on the p– layer, the source contact layer in contact with the source electrode, a trench extending through the source contact layer and the p– layer; and a gate structure formed in the trench comprising an AlN layer formed on the sidewall of the trench, an insulating cap layer formed on the AlN layer, and a gate electrode formed on the insulator cap layer and covering the sidewall of the trench.

These and other features and advantages will become further apparent from the detailed description and accompanying figures that follow. In the figures and description, numerals indicate the various features, like numerals referring to like features throughout both the drawings and the description.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figure 1:
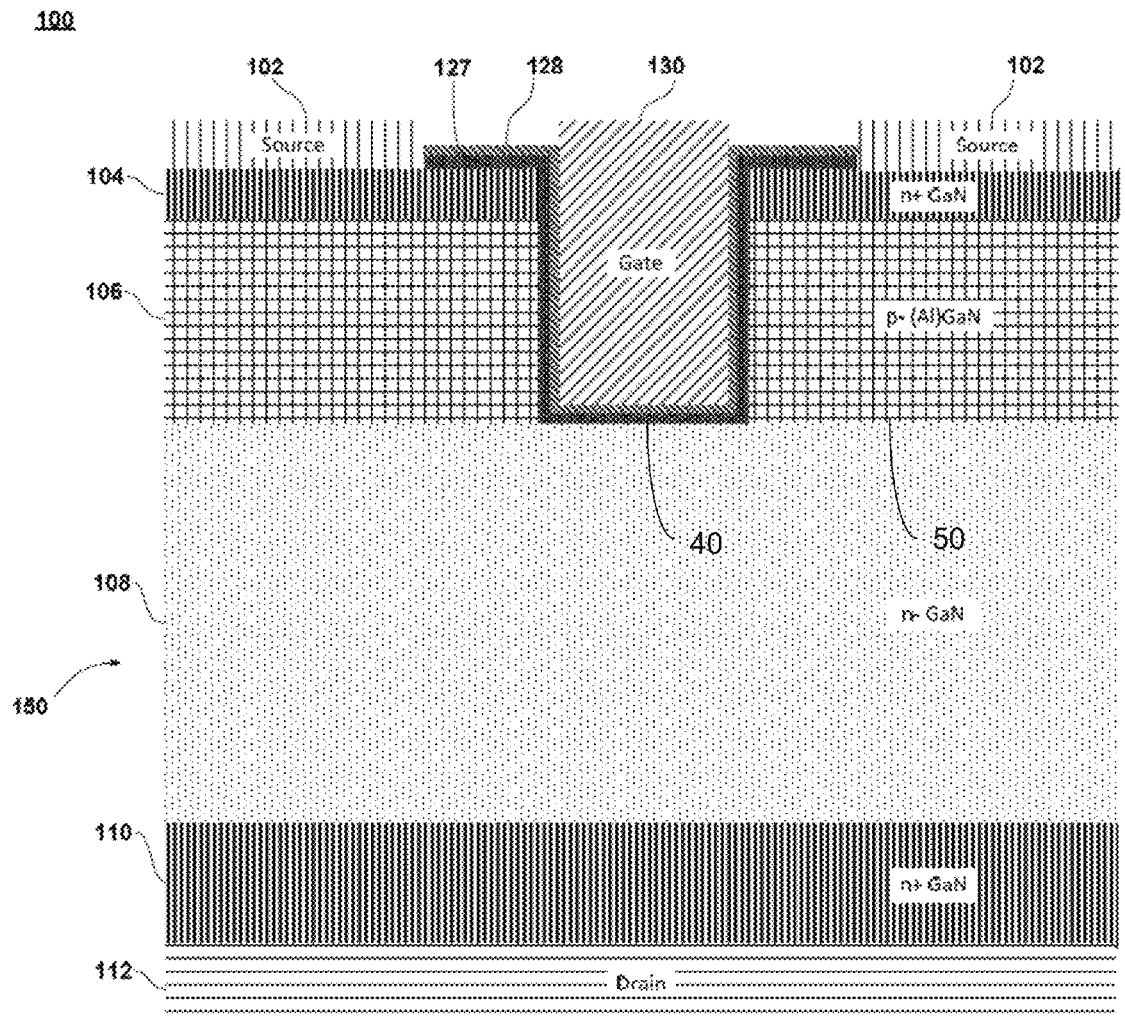
FIG. 1 is a cross-section view of a GaN vertical transistor according to principles of the present technology.

FIG. 1 is a cross-section view of a GaN vertical transistor according to principles of the present technology. The transistor 100, as shown in FIG. 1, has at least one source electrode 102 and a gate electrode 130 on the top surface of a device 150. A drain electrode 112 is on the bottom surface of the device 150. III-nitride semiconductor layers are fabricated between the source electrode 102 and the drain electrode 112. The III-nitride semiconductor layers include (from bottom to top of FIG. 1): a heavily doped n+ type GaN drain contact layer 110, a lightly doped n– type GaN drift or channel layer 108, a highly doped p-type GaN or AlGaN base layer 106, and a highly doped n+ type GaN source contact layer 104.

A gate structure includes a trench with the following layers fabricated on the sidewalls of the trench: an AlN layer 127 and an insulator cap layer 128. In one embodiment, the insulator cap layer is formed atop of the AlN layer, which is itself formed on the sidewalls of the trench. The gate electrode 130 is formed over the insulator cap layer 128 and covers at least the insulator cap layer 128 on the sidewalls of the trench. As shown in FIG. 1, a bottom 40 of the AlN layer 127 does not extend below a bottom 50 of the p-type base layer 106.

Figure 2:
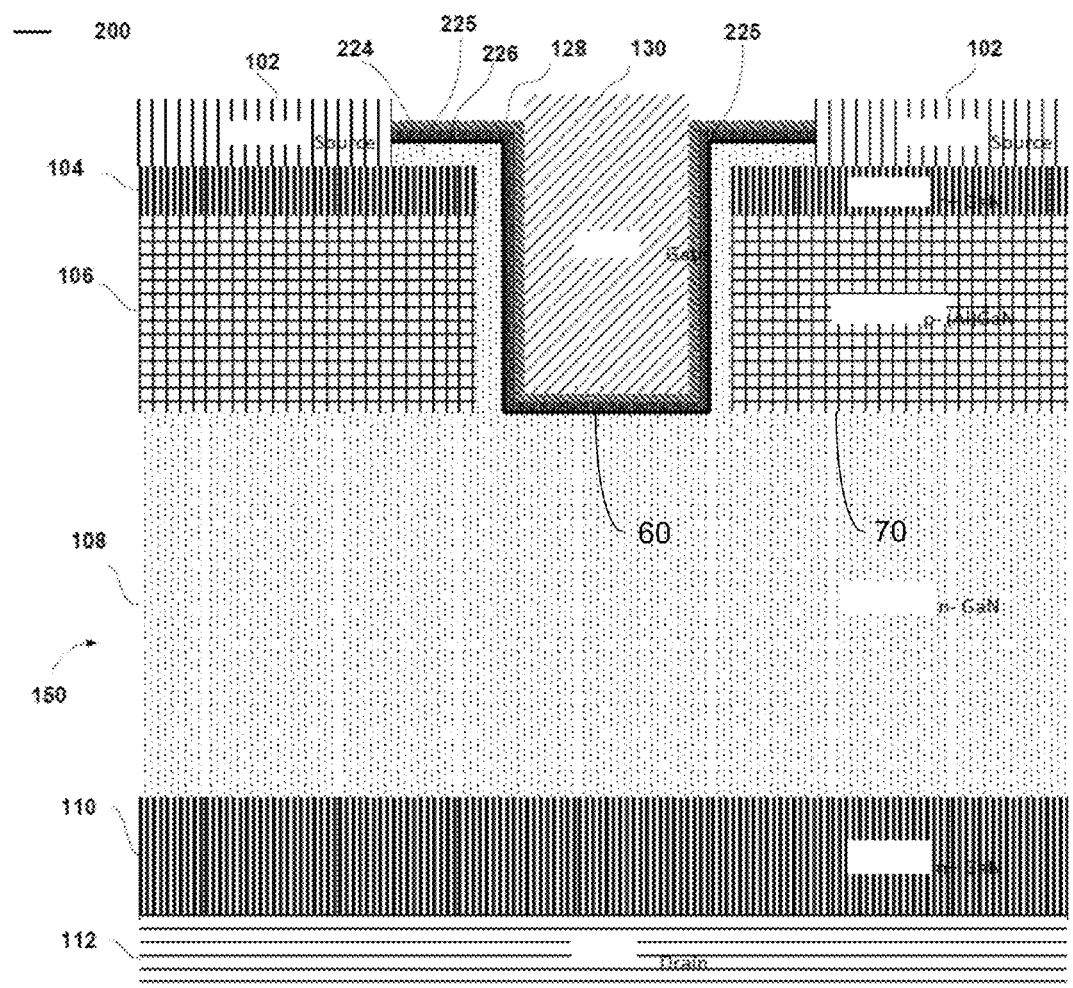
FIG. 2 is a more detailed cross-section view of a GaN vertical transistor according to principles of the present technology.

FIG. 2 is a cross-section view of an alternative embodiment of a GaN vertical transistor 200 according to principles of the present technology. In FIG. 2, those elements which are the same as in FIG. 1 are designated with the same reference number, and are not described in detail below. The transistor 200, as shown in FIG. 2, includes a source electrode 102 and a gate electrode 130 on the top surface of device 150, a drain electrode 112 on the bottom surface of the device 150, and layers 104, 106, 108 and 110 as described above with reference to FIG. 1.

In FIG. 2, a gate structure comprises a trench with the following layers fabricated on the sidewalls of the trench: a GaN channel layer 224; a single-crystalline AlN layer 225; a poly-crystalline AlN layer 226; and an insulator cap layer 128. The gate electrode 130 is formed atop the insulator cap layer 128 and covers at least the sidewalls of the trench. The GaN channel layer 224 is continuous with the channel layer 108, and layer 224 is formed on the sidewalls of the trench and may be in contact with the source electrodes 102. The single-crystalline AlN layer 225 is on top of layer 224, and the poly-crystalline AlN layer 226 is on top of layer 225. The insulator cap layer 128 is on top of the poly-crystalline AlN layer 226. The gate electrode 130 is formed atop the insulator cap layer 128 and covers at least the insulator cap layer 128 on the sidewalls of the trench. As shown in FIG. 2, a bottom 60 of the single-crystalline AlN layer 225 does not extend below a bottom 70 of the p-type base layer 106.

The methods for fabricating the device of FIG. 1 or 2 are described below. Those elements which are the same as those in FIG. 1 and FIG. 2 are designated with the same reference numbers and are not described in detail below. A lightly doped n− GaN drift layer 108 is first grown on top of the highly doped n+ GaN drain contact layer 110, by Metal-Organic Chemical Vapor Deposition (MOCVD) or Molecule Beam Epitaxy (MBE). The dopants for n− type GaN drift or channel layer 108 may be typically Si, O, Ge, or combinations thereof. The highly doped n+ GaN drain contact layer 110 has a doping concentration typically greater than $10^{17}$ cm$^{-3}$ and less than $10^{21}$ cm$^{-3}$. The drift layer 108 has a doping concentration typically in the range of $10^{15}$ cm$^3$ to $10^{17}$ cm-3. The thickness of the drift layer 108 is typically in the range of 0.5 μm to 50 μm. On top of the drift layer 108, a p-type GaN base layer 106 is grown by MOCVD or MBE. The dopant for the p-type GaN 106 layer may be typically Mg, and the doping concentration may be between $10^{17}$ cm$^{-3}$ to $10^{20}$ cm$^{-3}$. The thickness of the p-type GaN base layer 106 is typically in the range of 0.1 μm to 10 μm. On top of the p-type GaN base layer 106, a highly doped n+ GaN source layer 104 is grown by MOCVD or MBE. The dopants for the n+ GaN source layer 104 may be typically Si, O, Ge, or combinations thereof, and have a doping concentration typically greater than $10^{17}$ cm$^{-3}$ and less than $10^{21}$ cm$^{-3}$. The thickness of the n+ GaN source layer 104 is typically in the range of 0.01 μm to 1 μm.

A gate trench 302 is formed in to the stack of GaN layers between the source electrodes 102, with the bottom of trench extending through the p− type GaN base layer 106 and stopping inside the n− GaN drift layer 108. The gate trench 302 is typically formed by inductively coupled plasma etch, with Cl-based chemistries. The gate trench 302 is formed with vertical sidewalls. The width of the gate trench is typically in the range of 0.5 μm to 5 μm.

To form the device of FIG. 1, a gate dielectric stack is then formed over the sidewalls of the gate trench. One example of the gate dielectric stack, as shown in FIG. 1, is a bilayer of AlN 127 and an insulator cap layer 128 of SiN. The AlN layer 127 may be typically grown by MOCVD, with the thickness ranging from 1 nm to 100 nm. The SiN cap layer 128 is typically grown by MOCVD or Low-Pressure Chemical Vapor Deposition (LPCVD), with the thickness ranging from 1 nm to 100 nm. Source openings may be then be formed through the gate dielectric stack by patterning and etching or other known method, stopping on or within the n+ GaN source layer 104. Source electrodes 102 may then be formed on the source openings. A gate electrode 130 may be formed in the gate trench over the SiN cap layer 128 on the sidewalls of the trench. A drain electrode 112 is formed on the highly doped n+ GaN layer 110 on the backside of the device.

Figure 3A:
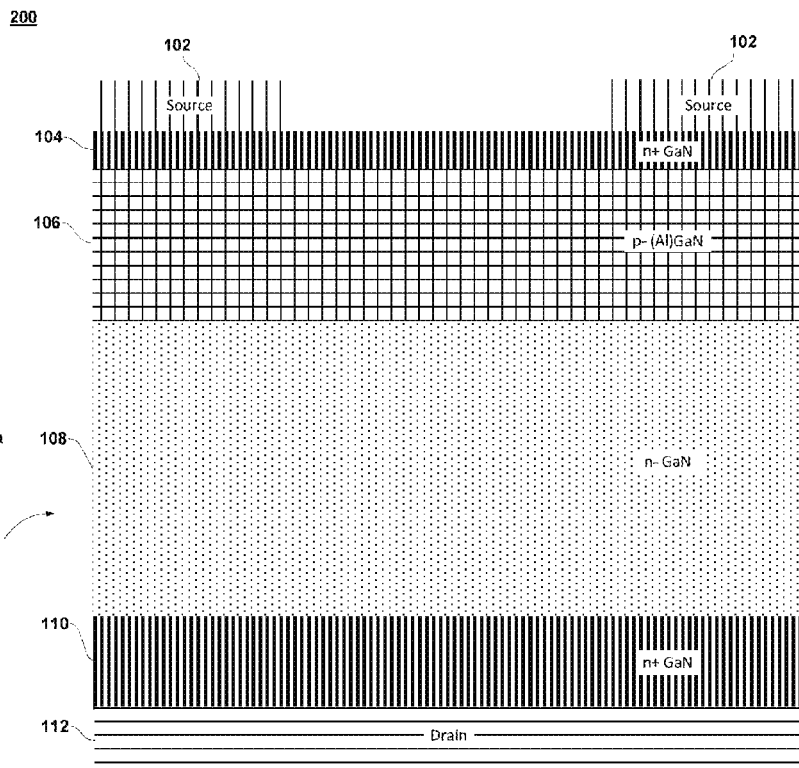
FIGS. 3A, 3B, 3C, 3D, 3E, 3F, and 3G are fabrication diagrams illustrating the fabrication of a GaN vertical transistor as illustrated in FIG. 2, in accordance with principles of the present technology.
Figure 3B:
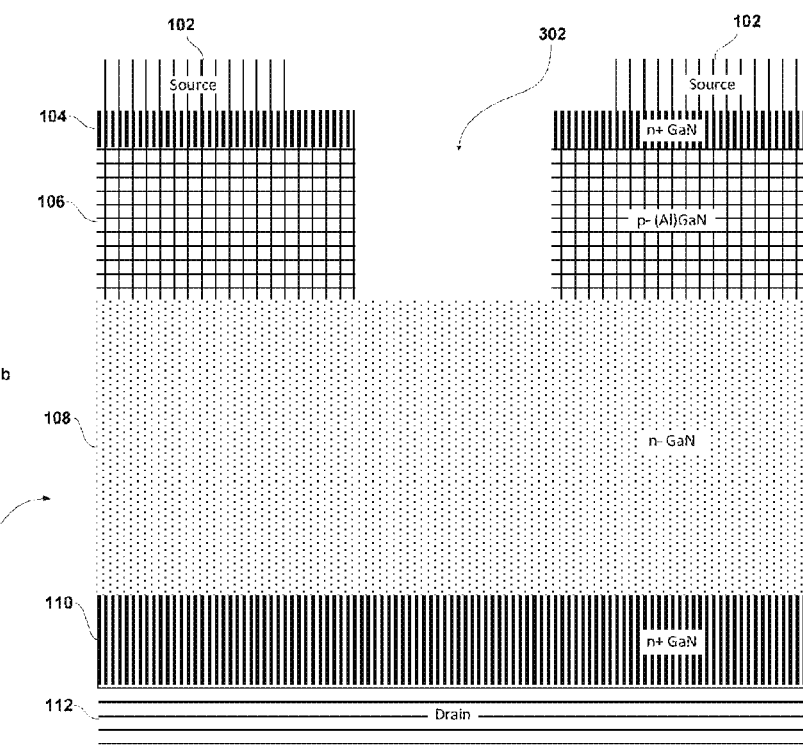
Figure 3C:
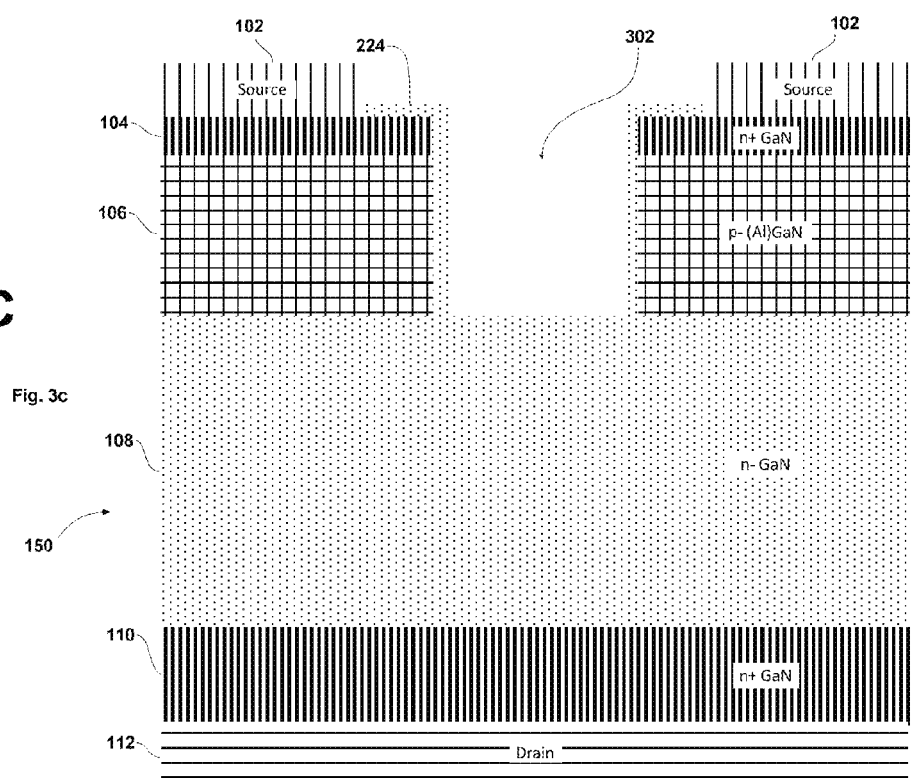
Figure 3D:
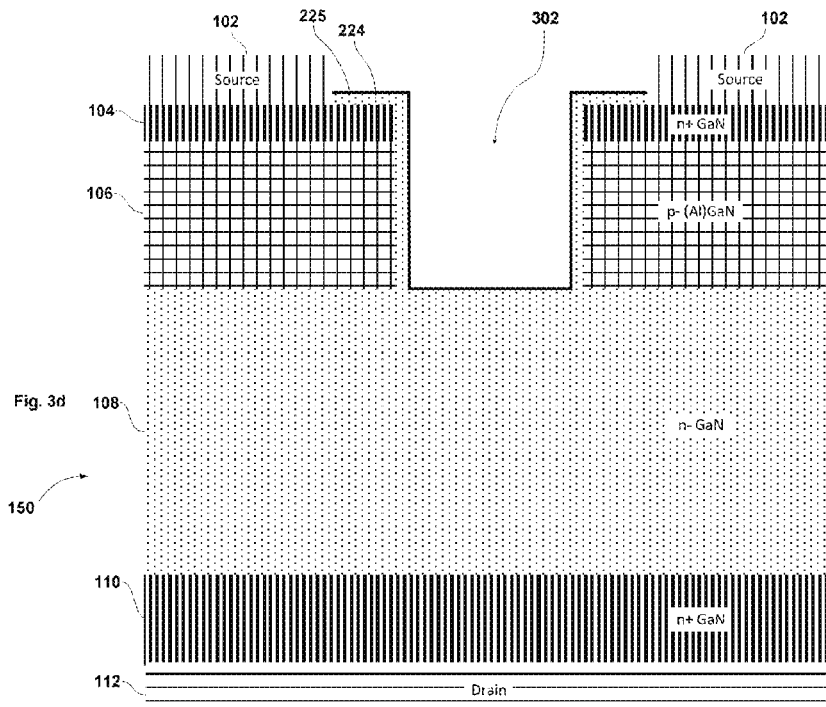
Figure 3E:
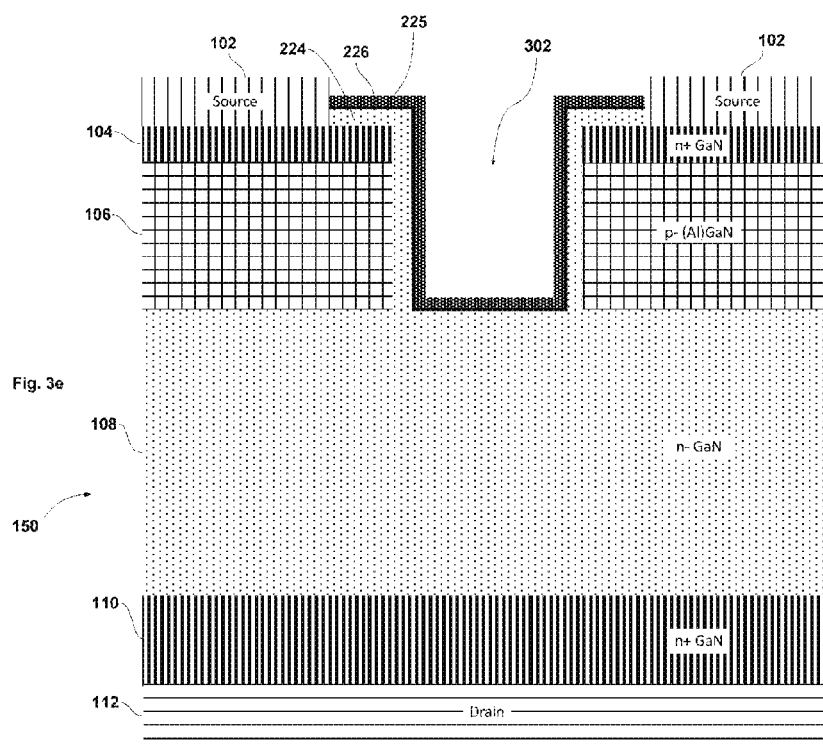
Figure 3F:
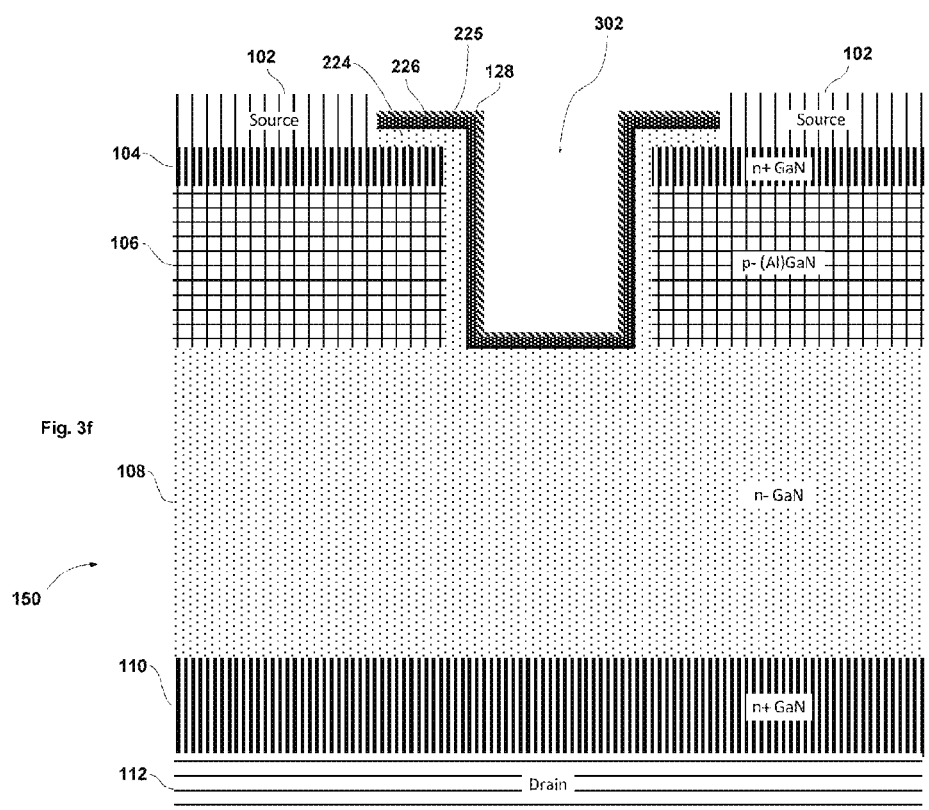
Figure 3G:
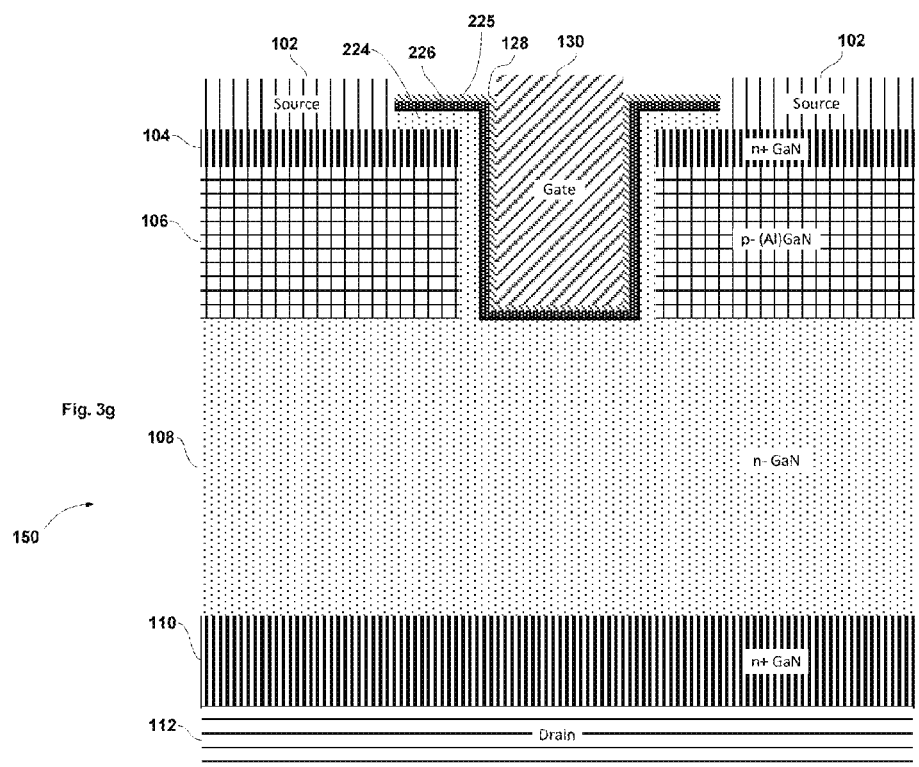

FIGS. 3A to 3G are fabrication diagrams of the GaN vertical transistor 200 illustrated in FIG. 2. In FIG. 3A, the substrate 150 has been fabricated with the III-nitride semiconductor layers 104, 106, 108 and 110, as described above, and the source electrodes 102 and drain electrode 112 electrode have been formed on the frontside and backside of the device 150, respectively. In FIG. 3B, a trench 302 with vertical sidewalls is formed by etching from the surface of the source contact layer 104, through the base layer 106, and stopping within the drift or channel layer 108. In FIG. 3C, a thin GaN channel layer 224 (having a typical thickness from about 1 to 10 nm) is regrown by metal organic chemical vapor deposition (MOCVD) or molecular beam epitaxy (MBE) on the sidewalls of the trench 302. The GaN channel layer 224 also is in contact with the drift or channel layer 108. In FIG. 3D, following the regrowth of the GaN channel layer 224, a very thin single-crystalline AlN layer 225 (with typical thickness of about 0.5 to 2 nm) is regrown by MOCVD or MBE atop the GaN channel layer 224, which forms a high-mobility (low resistance) channel at the interface between the channel layer 108 and the single-crystalline AlN layer 225. In FIG. 3E, following the regrowth of the single-crystalline AlN layer 225, a polycrystalline AlN layer 226 (typically from about 5 to 50 nm thick) is grown by MOCVD or MBE atop the single-crystalline AlN layer 225 to separate the surface/interface states from the channel. The single-crystalline AlN layer and the polycrystalline AlN layer 226 may be grown by MOCVD at a temperature between 600° C. and 1000° C. In FIG. 3F, following the regrowth of the polycrystalline AlN layer 226, an insulator cap layer 128, for example SiN or $Al_2O_3$, is formed atop the poly-crystalline AlN layer 226 to prevent leakage current. In FIG. 3G, the gate electrode 130 is formed on top of the insulator cap layer 128, typically filling the trench 302.

In operation, when a large enough positive bias is applied between the gate and the source electrode, a high-mobility (low-resistance) electron channel is formed at the interface between the gate dielectric stack and the sidewall of the etched semiconductor trench. The channel provides a current path between the source and the drain electrode. Because the insulator cap layer is disposed in the gate dielectric, a large gate-to-source bias can be applied without incurring excessive gate leakage current. A large gate-to-source bias is desirable because the switching time can be reduced, and a higher threshold voltage can be accommodated. The AlN layer provides a high quality interface with the semiconductor, which is needed for high electron mobility and minimal trapping effect.

When the gate-to-source bias is zero or negative, there is no mobile electron in the channel 108. The high-resistivity channel cuts off the current path, supporting a certain voltage drop between the source and the drain electrode.

Transistors according to principles of the present technology exhibit high-efficiency power switching, and in particular high current density, low on-resistance, a normally off gate compatible with a high-electron-mobility channel exhibiting a low channel resistance.

More specifically, III-nitride transistors in accordance with principles of the present technology, are useful in high efficiency power switching applications. The vertical device structure illustrated in the drawings and described above, provides high current density and low on-resistance. A normally-off gate, is also provided by this transistor for safe operation. Further, the normally-off gate structure is compatible with a high-electron-mobility channel for achieving low channel resistance.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A transistor comprising:
   a drain electrode;
   a drain contact layer in contact with the drain electrode;
   a channel layer on the drain contact layer;
   a p– layer of AlGaN or GaN on the channel layer;
   a source contact layer on the p– layer;
   a source electrode in contact with the source contact layer;
   a trench extending through the source contact layer and the p– layer, the trench having a vertical sidewall; and
   a gate structure formed in the trench comprising:
      an AlN layer formed on the sidewall of the trench;
      an insulating cap layer formed on the AlN layer; and
      a gate electrode formed on the insulator cap layer and covering the sidewall of the trench;
      wherein a bottom of the AlN layer does not extend below a bottom of the p– layer.

2. The transistor of claim 1 wherein:
   the drain contact layer comprises n+ GaN;
   the channel layer comprises n– GaN;
   the p– layer comprises AlGaN or GaN; and
   the source contact layer comprises n+ GaN.

3. The transistor of claim 1, wherein the AlN layer comprises
   a single-crystalline AlN layer formed on the sidewall of the trench; and
   a poly-crystalline AlN layer formed on the single-crystalline AlN layer.

4. The transistor of claim 3:
   wherein the single-crystalline AlN layer ranges from about 0.5 nm to 2 nm thick; and
   wherein the poly-crystalline AlN layer ranges from about 5 nm to 50 nm thick.

5. The transistor of claim 3 wherein the single-crystalline AlN layer is grown by MOCVD or MBE.

6. The transistor of claim 3 wherein the poly-crystalline AlN layer is grown by MOCVD or MBE.

7. The transistor of claim 3:
   wherein the single-crystalline AlN layer is grown by MOCVD at a temperature between 600° C. and 1000° C.; and
   wherein the poly-crystalline AlN layer is grown by MOCVD at a temperature between 600° C. and 1000° C.

8. The transistor of claim 1 further comprising:
   a second GaN channel layer between the AlN layer and the sidewall of the trench;
   wherein the second GaN channel layer is in contact with the channel layer.

9. The transistor of claim 8 wherein the second GaN channel layer ranges from about 1 nm to 10 nm thick.

10. The transistor of claim 8 wherein the second GaN channel layer is grown by MOCVD or MBE.

11. The transistor of claim 1:
    wherein the trench has a width ranging between 0.5 μm to 5 μm.

12. A method of fabricating a transistor comprising:
    forming a drain contact layer;
    forming a channel layer on the drain contact layer;
    forming a p– layer on the channel layer;
    forming a source contact layer on the p– layer;
    forming a source electrode on the source contact layer;
    forming a drain electrode on the drain contact layer;
    forming a trench extending through the source contact layer and the p– layer, the trench having a vertical sidewall; and forming a gate structure in the trench comprising:
  forming an AlN layer on the sidewall of the trench;
  forming an insulating cap layer on the AlN layer; and
  forming a gate electrode on the insulator cap layer and covering the sidewall of the trench;
  wherein a bottom of the AlN layer does not extend below a bottom of the p– layer.

13. The method of claim 12 wherein:
  the drain contact layer comprises n+ GaN;
  the channel layer comprises n– GaN;
  the p– layer comprises AlGaN or GaN; and
  the source contact layer comprises n+ GaN.

14. The method of claim 12, wherein forming the AlN layer comprises
  forming a single-crystalline AlN layer on the sidewall of the trench; and
  forming a poly-crystalline AlN layer on the single-crystalline AlN layer.

15. The method of claim 14:
  wherein the single-crystalline AlN layer ranges from about 0.5 nm to 2 nm thick; and
  wherein the poly-crystalline AlN layer ranges from about 5 nm to 50 nm thick.

16. The method of claim 14 wherein the single-crystalline AlN layer is grown by MOCVD or MBE.

17. The method of claim 14 wherein the poly-crystalline AlN layer is grown by MOCVD or MBE.

18. The method of claim 14:
  wherein the single-crystalline AlN layer is grown by MOCVD at a temperature between 600° C. and 1000° C.; and
  wherein the poly-crystalline AlN layer is grown by MOCVD at a temperature between 600° C. and 1000° C.

19. The method of claim 12 further comprising:
  forming a second GaN channel layer between the AlN layer and the sidewall of the trench;
  wherein the second GaN channel layer is in contact with the channel layer.

20. The method of claim 19 wherein the second GaN channel layer ranges from about 1 nm to 10 nm thick.

21. The method of claim 19 wherein the second GaN channel layer is grown by MOCVD or MBE.

22. The method of claim 12:
  wherein forming the trench comprises forming the trench to have a width ranging between 0.5 µm to 5 µm.

23. A transistor comprising:
  a source electrode;
  a drain electrode;
  a drain contact layer comprising n+ GaN, the drain contact layer in contact with the drain electrode;
  a channel layer of n– GaN on the drain contact layer;
  a p– layer of AlGaN or GaN on the channel layer; and
  a source contact layer of n+ GaN on the p– layer, the source contact layer in contact with the source electrode;
  a trench extending through the source contact layer and the p– layer, the trench having a vertical sidewall; and
  a gate structure formed in the trench comprising:
    an AlN layer formed on the sidewall of the trench;
    an insulating cap layer formed on the AlN layer; and
    a gate electrode formed on the insulator cap layer and covering the sidewall of the trench;
    wherein a bottom of the AlN layer does not extend below a bottom of the p– layer.

24. The transistor of claim 23, wherein the AlN layer comprises
  a single-crystalline AlN layer formed on the sidewall of the trench; and
  a poly-crystalline AlN layer formed on the single-crystalline AlN layer.

25. The transistor of claim 24 further comprising:
  a second GaN channel layer between the AlN layer and the sidewall of the trench;
  wherein the second GaN channel layer is in contact with the channel layer.

26. The transistor of claim 25:
  wherein the single-crystalline AlN layer ranges from about 0.5 nm to 2 nm thick;
  wherein the poly-crystalline AlN layer ranges from about 5 nm to 50 nm thick; and
  wherein the second GaN channel layer ranges from about 1 nm to 10 nm thick.

27. The transistor of claim 24:
  wherein the n+ GaN drain contact layer has a doping concentration greater than $10^{17}$ cm$^{-3}$ and less than $10^{21}$ cm$^{-3}$;
  wherein the channel layer has a doping concentration typically in the range of $10^{15}$ cm$^3$ to $10^{17}$ cm-3;
  wherein the p– type GaN layer has a doping concentration between $10^{17}$ cm$^{-3}$ to $10^{20}$ cm$^{-3}$; and
  wherein the n+ GaN source layer has a doping concentration greater than $10^{17}$ cm$^{-3}$ and less than $10^{21}$ cm$^{-3}$.

28. The transistor of claim 27:
  wherein the channel layer has a thickness in the range of 0.5 µm to 50 µm;
  wherein the p– type GaN layer has a thickness in the range of 0.1 µm to 10 µm; and
  wherein the n+ GaN source layer has a thickness in the range of 0.01 µm to 1 µm.

29. The transistor of claim 23:
  wherein the trench has a width ranging between 0.5 µm to 5 µm.

* * * * *